United States Patent
Arai et al.

[11] Patent Number: 5,744,963
[45] Date of Patent: Apr. 28, 1998

[54] BATTERY RESIDUAL CAPACITY MEASURING APPARATUS AND METHOD FOR MEASURING OPEN-CIRCUIT VOLTAGES AS THE BATTERY STARTS AND STOPS SUPPLYING POWER

[75] Inventors: Youichi Arai; Kenichi Shimoyama; Tsutomu Saigo; Yoshihide Takada, all of Shizuoka-ken, Japan

[73] Assignee: Yazaki Corporation, Tokyo, Japan

[21] Appl. No.: 609,128

[22] Filed: Feb. 29, 1996

[30] Foreign Application Priority Data

Mar. 3, 1995 [JP] Japan ................................. 7-044152

[51] Int. Cl.[6] .................................................. G01N 27/416
[52] U.S. Cl. ........................... 324/427; 324/431; 340/636; 320/48; 364/481
[58] Field of Search .................................. 320/426, 427, 320/428, 429, 433, 771, 48, 44; 340/636; 364/550, 551.01, 481

[56] References Cited

U.S. PATENT DOCUMENTS 5,193,067 3/1993 Sato et al. ............................. 364/481 X
5,287,286 2/1994 Ninomiya ................................ 364/481
5,404,106 4/1995 Matsuda ............................. 324/427 X
5,592,094 1/1997 Ichikawa ................................ 324/427

FOREIGN PATENT DOCUMENTS 8-62310 3/1996 Japan.

Primary Examiner—Vinh P. Nguyen
Assistant Examiner—Diep Do
Attorney, Agent, or Firm—Finnegan, Henderson, Farabow, Garrett & Dunner, L.L.P.

[57] ABSTRACT

While a power source is being supplied from a sub-battery by a voltage-current change trend calculating section, the voltage-current change trend calculating section collects currents from a battery and terminal voltages. A voltage-current approximate straight line calculating section obtains an approximately linear function, and a battery residual capacity calculating section obtains a residual capacity voltage based upon the approximately linear function and open-circuit voltages. A current storage stop discriminating section integrates the currents while the residual capacity voltage is lower than a previous residual capacity voltage, and when supplying from the sub-battery is stopped, obtains total capacity according to the open-circuit voltages at the stop and supplying and according to the integrated currents.

6 Claims, 4 Drawing Sheets

BATTERY RESIDUAL CAPACITY MEASURING APPARATUS AND METHOD FOR MEASURING OPEN-CIRCUIT VOLTAGES AS THE BATTERY STARTS AND STOPS SUPPLYING POWER

BACKGROUND OF THE INVENTION

1. Field of the Invention

The present invention relates to a method for calculating current total capacity of a battery and relates to a battery residual capacity measuring apparatus.

2. Description of the Related Art

In general, it is ideal to calculating a discharge amount from a load current and a terminal voltage so as to calculate residual capacity by subtracting the discharge amount from a full-charge amount.

However, in general, since a discharge characteristic of a battery varies with an ambient temperature, aged deterioration, etc., its residual capacity also varies with an ambient temperature, aged deterioration, etc.

In other words, during use of a battery, it is difficult to obtain its residual capacity considering deterioration of the battery and dispersion of the characteristic.

Therefore, for example, in an electric car battery residual capacity estimating method described in "Yuasa Report, April, 1992, No. 72, Takao Marui and others", discharge currents and terminal voltages of a battery are continuously measured and stored so that the residual capacity is estimated based upon the stored approximate values. The estimation is made as follows:

$$Y = \alpha X^2 + \beta X + Y$$

where X is a discharge amount (dischargeable residual capacity until an open-circuit voltage reaches a limited value), Y is a prediction value of an estimated open-circuit voltage, and $\alpha$, $\beta$ and Y are regression coefficients based upon the discharge currents and the terminal voltages of the battery until prescribed time.

In addition, residual capacity is obtained by a current integrating method, for measuring an amount of currents actually supplied from a battery to a load side and integrating the obtained values so as to estimate residual capacity according to the integrated current values and the amount of currents at the time of discharging and total energy capacity, and by a voltage detecting method, for measuring terminal voltages when a discharge current is supplied from the terminal of the battery to a load side so as to estimate residual capacity from total energy capacity.

However, in the above two methods, residual capacity should be obtained according to the above formula based upon voltages and integrated currents of the battery only after current total energy capacity of the battery is obtained. Moreover, since the above formula is an approximate formula, if the characteristic of the battery is deteriorated or dispersed due to aged deterioration, for example, accuracy of the obtained value has an error.

SUMMARY OF THE INVENTION

It is an object of the present invention to obtain total energy of a battery according to a state of battery capacity easily and accurately and thus to obtain accurate residual capacity.

A battery residual capacity measuring method of the present invention, for measuring open-circuit voltages of a battery as supplying of a power source from the battery is started or stopped, while the power source is being supplied, collecting currents from the battery and terminal voltages of the battery, and obtaining an approximately linear function so as to calculate and display residual capacity according to a residual capacity voltage based upon the approximately linear function and current total capacity of the battery, has the steps of: integrating the currents only while the residual capacity voltage is lower than a previous residual capacity voltage; and obtaining the total capacity according to the open-circuit voltage at the stop of supplying the power source and according to the open-circuit voltage due to the integrated currents and due to the start of supplying the power source when the supplying of the power source is stopped.

A battery residual capacity measuring apparatus has a voltage-current change trend calculating section for while a power source from a battery is supplied, collecting currents from the battery and terminal voltages of the battery; a voltage-current approximate straight line calculating section for while the power source is supplied, calculating an approximately linear function based upon the collected currents and the terminal voltages; a battery residual capacity calculating section for measuring open-circuit voltages of the battery according to the start or the stop of supplying the power source so as to calculate and display residual capacity according to a residual capacity voltage based upon the approximately linear function and according to current total capacity of the battery while the power source is being supplied, a current storage stop discriminating section for only while the residual capacity voltage is lower than a previous residual capacity voltage, integrating the currents so as to obtain and store the total capacity according to the open-circuit voltage at the stop of supplying the power source and according to the open-circuit voltage due to the integrated currents and due to the start of supplying the power source when the supplying of the power source is stopped.

In addition, the current storage stop discriminating section integrates the currents from the battery as the terminal voltages and the currents are collected, when the residual capacity voltage becomes higher than the previous residual capacity voltage, stops the integration of the currents, and when the residual capacity voltage recovers to the same level as the previous residual capacity voltage, restarts the integrating of the currents.

In addition, the residual capacity calculating section obtains a straight line containing an open-circuit voltage axis and a total capacity axis of the power source according to the open-circuit voltages, and when an area of the region surrounded by the straight line does not correspond to a region of the integrated currents, compensates the straight line based upon the area of the integrated currents so as to store an region surrounded by the compensated straight line as current total capacity of the battery.

In addition, the supplying or stopping of the power source is judged by an auxiliary power source, the power source is supplied or stopped by detecting an operation of an ignition key, and when the ignition key is turned off, the supplying of the power source is stopped at least after time required for the auxiliary power source voltage having the same level as the open-circuit voltages passes.

In accordance with the battery residual capacity measuring method of the present invention, as the supplying of the power source from the battery is started or stopped, the open-circuit voltages of the battery are measured. Then, while the power source is being supplied, the currents from the battery and the terminal voltages of the battery are collected, and the approximately linear function is obtained so that the residual capacity voltage is obtained according to the approximately linear function.

At this time, while the residual capacity voltage is lower than a previous residual capacity voltage, the currents are integrated, and the total capacity is obtained according to the integrated currents and the open-circuit voltages at the start and stop of supplying the power source. Then, the residual capacity according to the residual capacity voltage bases upon the approximately linear function and according to current total capacity is calculated and displayed.

In the battery residual capacity measuring apparatus of the present invention, while the power source is being supplied from the battery by the voltage-current change trend calculating section, the currents from the battery and the terminal voltages of the battery are collected, the approximately linear function is obtained by the voltage-current approximate straight line calculating section. Then, the residual capacity voltage and the open-circuit voltages according to the approximately linear function are obtained by the battery residual capacity calculating section, and while the residual capacity voltage is lower than a previous residual capacity voltage, the currents are integrated by the current storage stop discriminating section. When the supplying the power source is stopped, the total capacity can be obtained according to the open-circuit voltage due to the stop and the supplying of the power source and due to the integrated currents.

In addition, when the residual capacity voltage becomes higher than a previous residual capacity voltage, the integration of the currents is stopped by the current storage stop discriminating section. When the residual capacity voltage has the same level as the previous residual capacity voltage, the integrating of the currents is restarted.

Furthermore, the straight line containing the open-circuit voltage axis and the power source total capacity axis is obtained by the residual capacity calculating section based upon the open-circuit voltages, and when the area of the domain surrounded by the straight line does not correspond to the domain of the integrated currents, the straight line is compensated based upon the domain of the integrated currents. Then, an area surrounded by the compensated straight line is stored as the current total capacity of the battery.

Further, the operation of the ignition key is detected by the power source supplying control circuit, and the supplying and stop of the auxiliary power source is controlled. When the ignition key is turned off, the supplying of the power source is stopped at least after the time required for the auxiliary power source reaching the open-circuit voltages passes.

For a fuller understanding of the nature and advantages of the invention, reference should be made to the ensuing detailed description taken in conjunction with the accompanying drawings.

DETAILED DESCRIPTION OF THE PREFERRED EMBODIMENTS

In the present embodiment, in the case where residual capacity of a battery mounted to an electric car is measured, the battery residual capacity measuring apparatus of the present invention is used. Moreover, an open-circuit is a state that a load is not closed.

Figure 1:
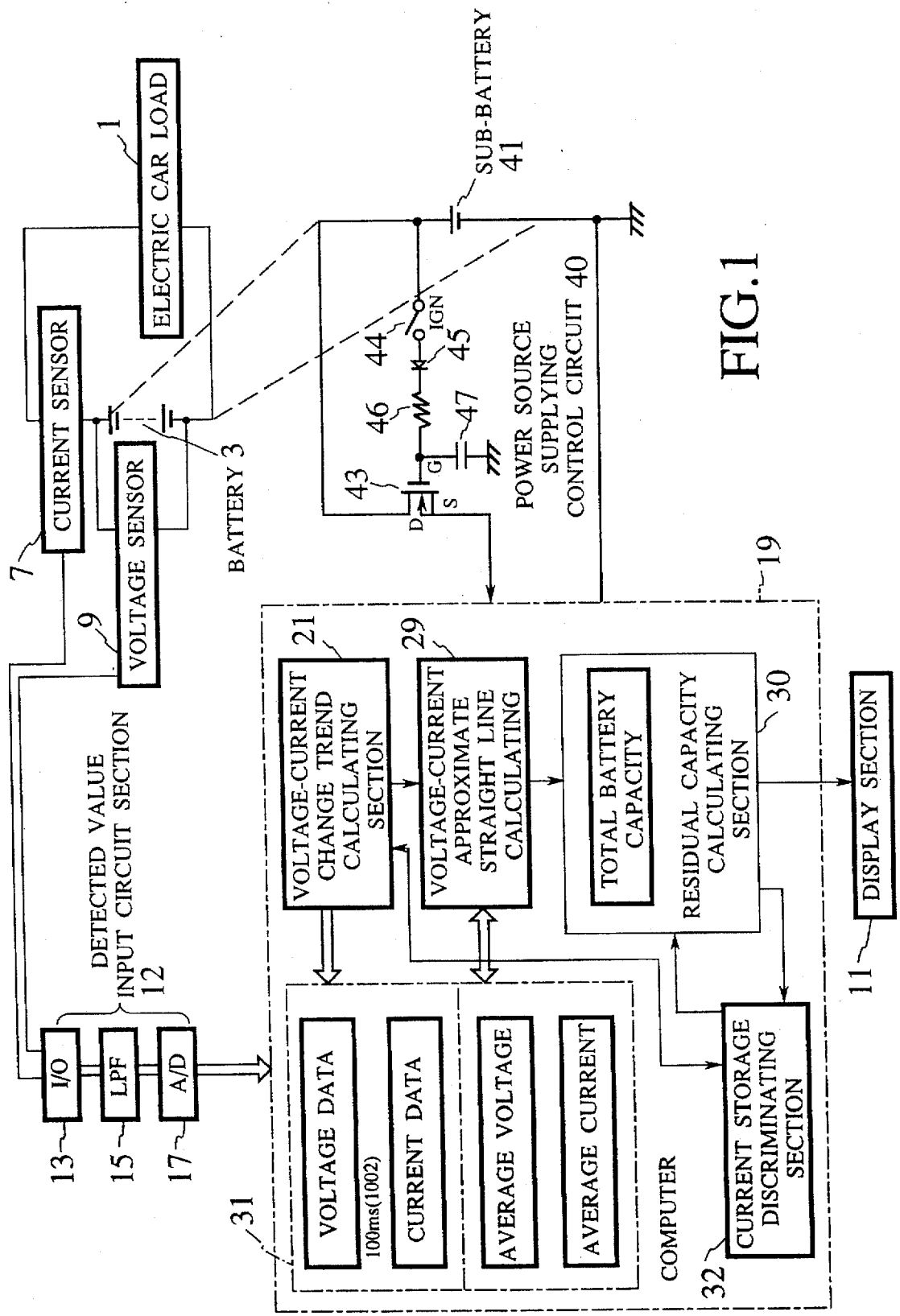
FIG. 1 is a schematic constitutional drawing of the present embodiment.

FIG. 1 is a schematic constitutional drawing of the present embodiment. In FIG. 1, 1 is an electric car load (motor, for example) connected to a battery 3, 7 is a current sensor for detecting a current flows in the electric car load (i.e. load), and 9 is a voltage sensor for detecting a terminal voltage of the battery 3.

12 is a detected value input circuit section. The detected value input circuit section 12 is composed of I/O 13, LPF 15 and A/D 17. The detected value input circuit section 12 inputs a discharge current and a terminal voltage of the battery as a detected voltage and a detected current thereinto from the voltage sensor 9 and the current sensor 7. Then, the detected value input circuit section 12 eliminates noises from the detected current and detected voltage and digitally converts them.

19 is a computer. The computer 19 is composed of a voltage-current change trend calculating section 21, a voltage-current approximate straight line calculating section 29, a residual capacity calculating section 30, a current storage discriminating section 32, etc., and the computer 19 is connected to a power source supplying control circuit 40.

The voltage-current change trend calculating section 21 inputs the digital detected current and voltage of the battery 3 per 1 ms from the detected value input circuit section 12 and transmits them to a memory 31. The memory 31 averages the currents and voltages every time 100 currents and voltages are stored therein, and outputs them every time 100 averaged currents and voltages are obtained.

The voltage-current approximate straight line calculating section 29 reads a plurality of voltage values and current values from the memory 31, and obtains the sum of the square of the errors of the voltage values and the current values. Then, the voltage-current approximate straight line calculating section 29 obtains values "a" and "b" for minimize the errors, and obtains a voltage-current approximately linear function (Y=aX+b) based upon "a" and "b".

The residual capacity calculating section 30 specifies a voltage value X (residual capacity voltage) on a voltage axis-current axis from a predetermined discharge current value Y according to the primary formula (Y=aX+b) every time the voltage-current approximately linear function is obtained by the voltage-current approximate straight line calculating section 29, and obtains the residual capacity according to the voltage value X as a percentage (1%–100%).

In addition, as a sub-battery 41 supplies power, or has its power supply interrupted to the computer 19, open-circuit voltages of the battery 3 are measured by the computer 19. While the sub-battery 41 is supplying a power source, the residual capacity can be calculated and displayed according to the residual capacity voltage, which was obtained based upon the approximately linear function, and obtained current total energy capacity of the battery 3.

In addition, a straight line containing an open-circuit voltage axis and a total capacity axis of the battery 3 is obtained based upon the open-circuit voltages. When a domain of the integrated currents does not correspond to a domain surrounded by the straight line, the straight line is compensated based upon the domain of the integrated currents, and the area surrounded by the compensated straight line is stored as current total capacity of the battery 3.

As the current storage discriminating section 32 stores the terminal voltages and currents, it integrates currents from the battery 3. When the residual capacity voltage becomes higher than a previous residual capacity voltage, the current storage discriminating section 32 stops integrating the currents, and when the residual capacity voltage recovers to the same level of the previous residual capacity voltage, the current storage discriminating section 32 restarts integrating the currents.

The power source supplying control circuit 40 has the sub-battery 41, a power MOSFET 43, a series circuit composed of an ignition key switch 44, a diode 45, a resistance 46, and a capacitor 47. A drain of the power MOSFET 43 is connected to the sub-battery 41, and its source is connected to the computer 19. One end of the series circuit is connected to the sub-battery 41, the other end is connected to a gate of the power MOSFET 43, and the capacitor 47 is connected to the gate of the power MOSFET 43.

Figure 2:
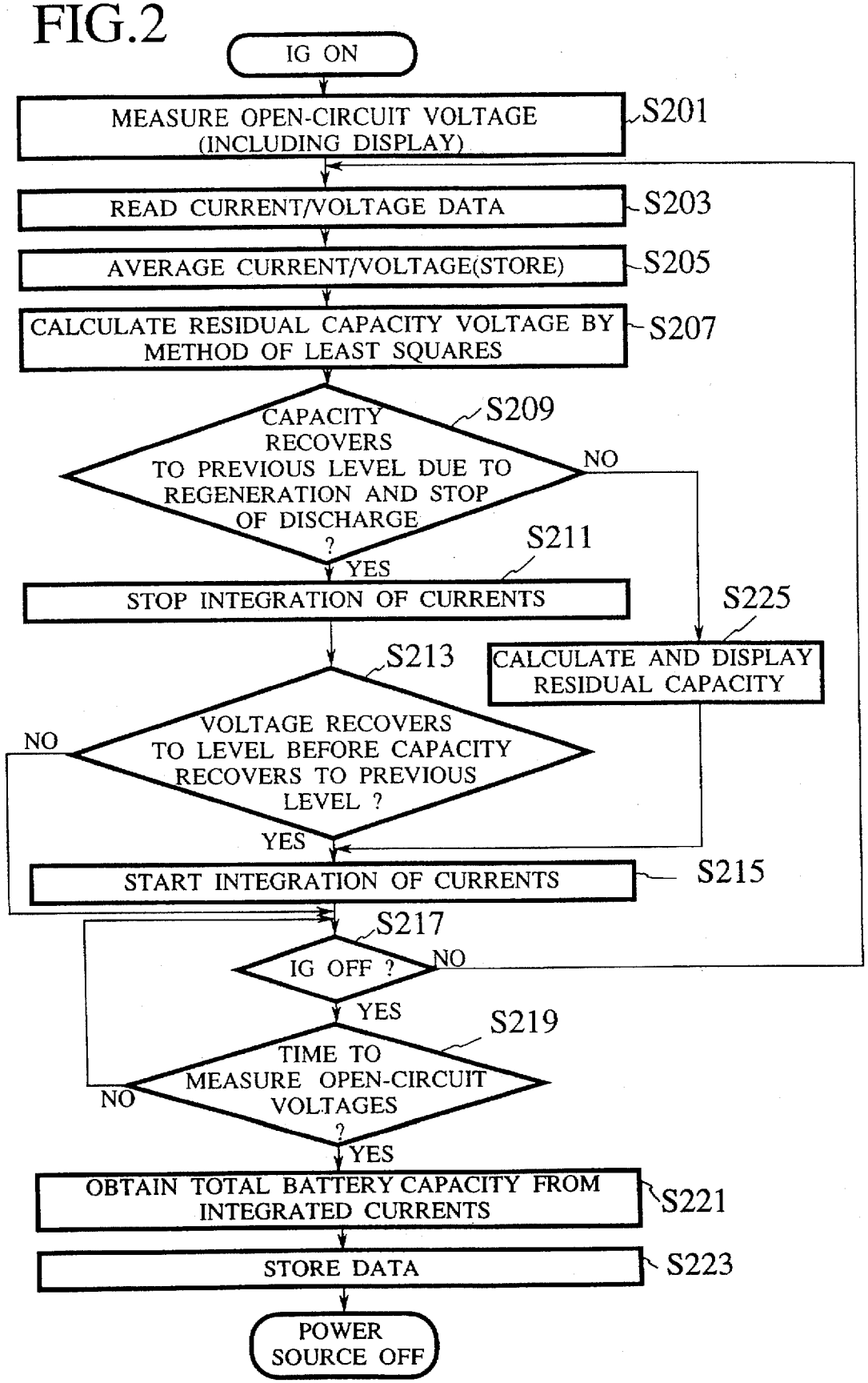
FIG. 2 is a flow chart which explains an operation of the present embodiment.

The following describes a schematic operation of the battery residual capacity measuring apparatus having the above-mentioned arrangement. FIG. 2 is a flow chart which describes the operation of the present embodiment. The present embodiment also explains the operation of the power source supplying control section 40.

For example, when the ignition 44 is turned on, a control signal is output to the power MOSFET 43 through the diode 45, the resistance 46 and the capacitor 47. Then, the power MOSFET 43 is turned on so that electric power of the sub-battery 41 is supplied to the computer 19.

Immediately after the power source is supplied from the power source supplying control circuit 40 to the computer 19 (immediately after the ignition is turned on), the computer 19 reads open-circuit voltages detected by the voltage sensor 9, and converts initial residual capacity into percentage so as to display the percentage on the display section 11 (S201).

Figure 3:
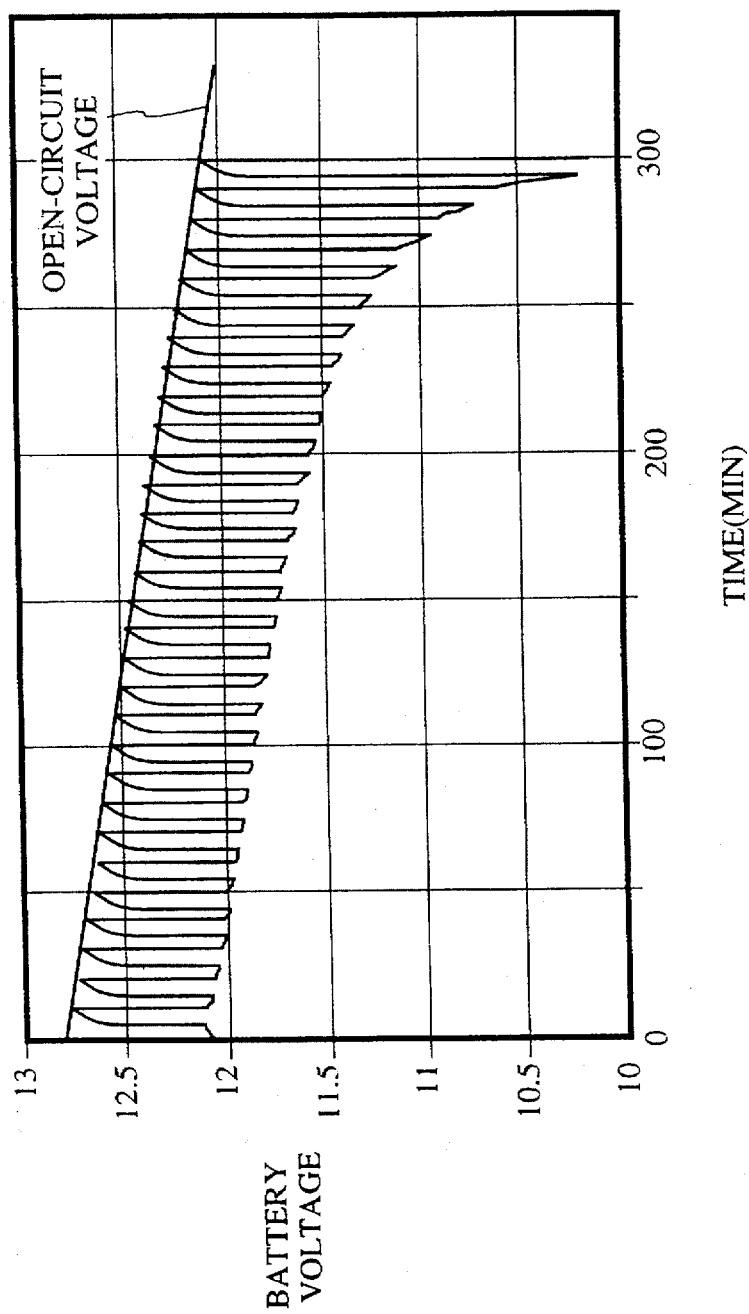
FIG. 3 is an explanatory drawing of an open-circuit voltage.

The open-circuit voltages are voltages of the circuit when a car immediately after the on-operation of the ignition is still at a standstill (the load is not changed), and it is shown as an approximate straight line in FIG. 3. Moreover, the initial residual capacity is residual capacity according to the voltages when the car is at a standstill. Therefore, the residual capacity is accurate.

Next, the car starts moving, the voltage-current change trend calculating section 21 reads terminal voltages of the battery 3 detected by the voltage sensor 9 and currents detected by the current sensor 7 (discharge current) (S203), and stores the sampling data so as to average them when a prescribed number of the voltages and currents are stored (S205).

Successively, an approximate straight line is obtained according to the averaged data, and the intersection of the approximate straight line and the voltage axis of a reference discharge current (I=0) is calculated as a voltage V (hereinafter, referred to as residual capacity voltage) by the method of the least squares (S207). At this time, the residual capacity voltage V is read, and a judgment is made as to whether the residual capacity voltage is higher than the previous residual capacity voltage V, namely, as shown in FIG. 2, as to whether the residual capacity voltage is recovered by inherent properties of the battery 3 (e.g., regeneration, stop of discharge). Next, when the judgment at step S209 is yes, that is, the residual capacity voltage recovers to be in excess of the previous capacity voltage V, the storage of discharging currents is suspended, as shown in step S211.

Then, a judgment is made as to whether the residual capacity voltage V recovers to the same level as the previous residual capacity voltage V, namely, as to whether the residual capacity voltage recovers to the level of the residual capacity V previous to recovering the original capacity due to regeneration and the stop of discharge (S213).

When the residual capacity voltage recovers to the level of the residual capacity voltage V previous to recovering to its original level due to regeneration and stop of discharge, the integration of the currents is started (S215).

Figure 4:
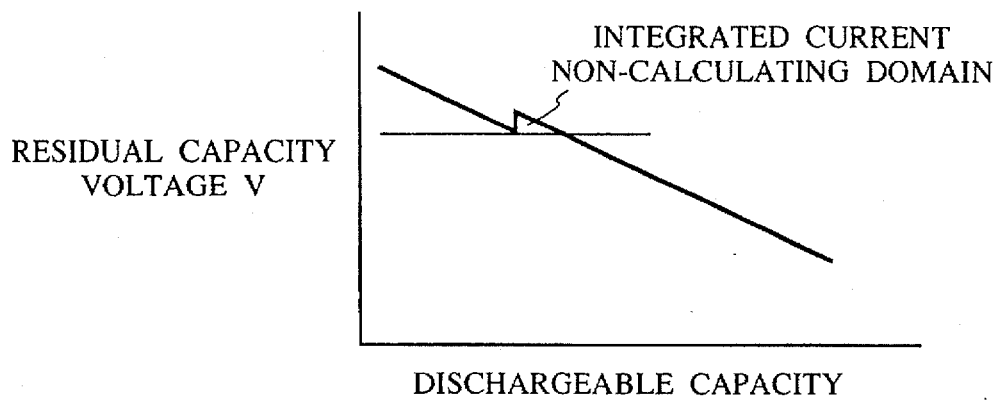
FIG. 4 is an explanatory drawing which shows an integrating domain of integrated currents.

In other words, a relationship between the residual capacity voltage and the current total energy of the battery (dischargeable capacity) is shown as a straight line shown in FIG. 4. In a rise portion in FIG. 4 (integrated current non-calculated domain), the integration of the currents is stopped, and when the residual capacity voltage recovers to the level of the residual capacity voltage V immediately previous to the rise portion, the integration of the currents is started.

Next, a judgment is made as to whether the ignition is off (S217). When the ignition is not off, the sequence of the operation goes to the step S203 so that the above process is performed.

In addition, when the judgment is made that the ignition is turned off, a judgment is made as to whether it is time to measure the open-circuit voltages (S219). When it is not time to measure the open-circuit voltages, the sequence of the operation goes to the step S203 so that the residual capacity is calculated by the method of the least squares until the ignition is turned off.

As to the step S219, supplementary description is given. For example, when an electric car moves and stops, and the ignition is turned off, the battery does not immediately have an open-circuit voltage, but gradually has the open-circuit voltage.

In other words, in the case where the ignition is turned off and immediately turned on, the voltage of the sub-battery 41 becomes little higher than the voltage immediately after the ignition is turned off. Therefore, when the ignition is turned off, the power supply to computer 19 is not stopped immediately, but turned off after a judgment is made as to whether the voltage of the sub-battery 41 has the same level as the open-circuit voltage by controlling the power MOSFET 43 by the capacitor 47 (it is set so as to have a time constant according to time required for the voltage of the sub-battery 41 having the same level as the open-circuit voltage when the ignition is turned off).

Next, when the judgment is made that the open-circuit voltage should be measured, the total battery capacity is obtained from the integrated currents up to the present time, (S221), and the data are stored (S223).

Then, when it is time to measure the open-circuit voltage, namely, the discharge of the capacitor in the power source supplying control section 40 is completed, the power source of the sub-battery is turned off.

In addition, the judgment is made that the residual capacity voltage does not recover to the level of the open-circuit voltage due to the regeneration and the stop of discharge at S209, the residual capacity voltage V is converted into a percentage and the percentage is displayed (S225). The display is changed per 1 percent.

Figure 5:
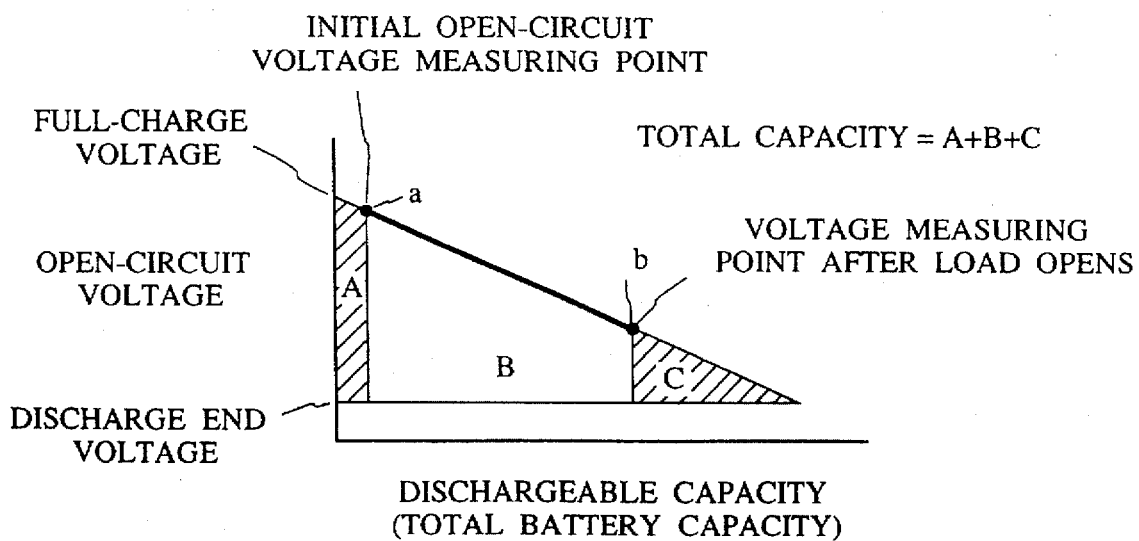
FIG. 5 is an explanatory drawing which explains calculation of total capacity.

In other words, in the above embodiment, a relationship between the open-circuit voltages of the battery and the dischargeable capacity of the battery when the load is closed (the car is standstill) is shown as a straight line of FIG. 5.

According to the above, when a full-charge voltage and a final discharge voltage are determined as shown in FIG. 5, a measured open-circuit voltage Vn is positioned on the straight line of FIG. 5. When an initial open-circuit voltage measuring point "a" at the time of turning on the ignition and a load-open voltage measuring point "b" at the time of turning off the ignition can be measured, the currents in the domain "B" are integrated. As a result, since the integrated values and the capacity in the voltage domain between the points "a" and "b" correspond to the domain "B", the residual domains can be easily obtained, and the value obtained by adding the domains "A", "B" and "C" becomes the total energy capacity of the battery.

In addition, when the domain "B" based upon the integrated current values does not correspond to the straight line, the straight line is compensated so that the total energy capacity is obtained.

Therefore, even if a battery is deteriorated or its characteristic is dispersed, the total energy capacity according to the battery can be obtained.

Here, the above embodiment describes the operation of the battery residual capacity measuring apparatus used in an electric car, but an apparatus whose discharge current greatly fluctuates or is constant may be used.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A battery residual capacity measuring apparatus, comprising:

a voltage-current change trend calculating section for while a battery is supplying power, collecting currents from the battery and terminal voltages of the battery;

a voltage-current approximate straight line calculating section for while the battery is supplying power, calculating an approximately linear function based upon the collected currents and the terminal voltages;

a battery residual capacity calculating section for measuring open-circuit voltages of the battery when the battery starts or stops supplying power so as to calculate and display a residual capacity according to a residual capacity voltage based upon the approximate linear function, and according to a total current capacity of the battery while the battery is supplying power; and a current storage stop discriminating section for, only while the residual capacity voltage is lower than a previous residual capacity voltage, integrating the currents so as to obtain and store the total current capacity according to the open-circuit voltage measured when the battery stops supplying power, and according to the open-circuit voltage due to the integrated currents and due to the start of supplying the power when the supply of power is stopped.

2. The battery residual capacity measuring apparatus according to claim 1, wherein said current storage stop discriminating section integrates the currents from the battery as the terminal voltages and the currents are collected, when the residual capacity voltage becomes higher than the previous residual capacity voltage, stops the integration of the currents, and when the residual capacity voltage recovers to the level of the previous residual capacity voltage, restarts the integration of the currents.

3. The battery residual capacity measuring apparatus according to claim 1, wherein said residual capacity calculating section obtains a straight line containing an open-circuit voltage axis and a total capacity axis of the power source according to the open-circuit voltages, and when an area of the region surrounded by the straight line does not correspond to a region of the integrated currents, compensates the straight line based upon the area of the integrated currents so as to store an region surrounded by the compensated straight line as current total capacity of the battery.

4. The battery residual capacity measuring apparatus according to claim 2, wherein the supplying or stopping of power is judged by an auxiliary power source, the power is supplied or stopped by an operation of an ignition key, and when the ignition key is turned off, the supplying of power is not stopped until at least the voltage of the auxiliary power source has the same level as the open-circuit voltage.

5. A method for measuring residual capacity in a battery, comprising the steps of:

collecting currents and terminal voltages for the battery while it is supplying power to a load;

calculating an approximately linear function based upon the collected currents and terminal voltages;

measuring open circuit voltages of the battery when the battery starts or stops supplying power to the load to calculate a residual capacity according to a residual capacity voltage based upon the approximately linear function;

integrating the currents only while the residual capacity voltage is lower than a previous residual capacity voltage; and obtaining the total capacity according to the open circuit voltage measured when the battery stops supplying power, and according to the open circuit voltage due to the integrated currents, and due to the start of supplying power when the supply of power is stopped.

6. A battery residual capacity measuring method which includes measuring open-circuit voltages of a battery when the power supply from the battery to an electrical load is started and stopped, and collecting current data from the battery and terminal voltage data of the battery while the power is supplied from the battery to the electrical load, thereby obtaining an approximately linear function so as to calculate and display residual capacity according to a residual capacity voltage based upon the approximately linear function and current total battery capacity obtained by the open-circuit voltages and the current data, said method further comprising the steps of:

integrating the current data only while the residual capacity voltage is lower than a previous residual capacity voltage; and obtaining the total capacity according to the open-circuit voltage when the supply of the power for the electrical load is stopped, the integrated current data, and the open-circuit voltage when the supply of the power for the electrical load is started.

* * * * *

REEXAMINATION CERTIFICATE (3976th)

United States Patent [19]
Arai et al.

[11] B1 5,744,963
[45] Certificate Issued Jan. 11, 2000

[54] BATTERY RESIDUAL CAPACITY MEASURING APPARATUS AND METHOD FOR MEASURING OPEN-CIRCUIT VOLTAGES AS THE BATTERY STARTS AND STOPS SUPPLYING POWER

[75] Inventors: Youichi Arai; Kenichi Shimoyama; Tsutomu Saigo; Yoshihide Takada, all of Shizuoka-ken, Japan

[73] Assignee: Yazaki Corporation, Tokyo, Japan

Reexamination Request:
No. 90/005,072, Jul. 10, 1998

Reexamination Certificate for:
Patent No.: 5,744,963
Issued: Apr. 28, 1998
Appl. No.: 08/609,128
Filed: Feb. 29, 1996

[30] Foreign Application Priority Data
Mar. 3, 1995 [JP] Japan .................................. 7-044152

[51] Int. Cl.$^7$ .................................................. G01N 27/416
[52] U.S. Cl. .......................... 324/427; 324/431; 340/636; 320/149; 320/146; 702/63
[58] Field of Search ...................................... 324/426, 427, 324/428, 429, 433, 771; 320/137, 146, 149; 702/63; 340/636

[56] References Cited

PUBLICATIONS

T. Marui et al., "A Method of Estimating the Residual Capacity of Batteries for Electric Vehicles," Yuasa–Jiho No. 72, Apr. 1992, pp. 4–11.

*Primary Examiner*—Diep N. Do

[57] ABSTRACT

While a power source is being supplied from a sub-battery by a voltage-current change trend calculating section, the voltage-current change trend calculating section collects currents from a battery and terminal voltages. A voltage-current approximate straight line calculating section obtains an approximately linear function, and a battery residual capacity calculating sections obtains a residual capacity voltage based upon the approximately linear function and open-circuit voltages. A current storage stop discriminating section integrates the currents while the residual capacity voltage is lower tha a previous residual capacity voltage, and when supplying from the sub-battery is stopped, obtains total capacity according to the open-circuit voltages at the stop and supplying and according to the integrated currents.

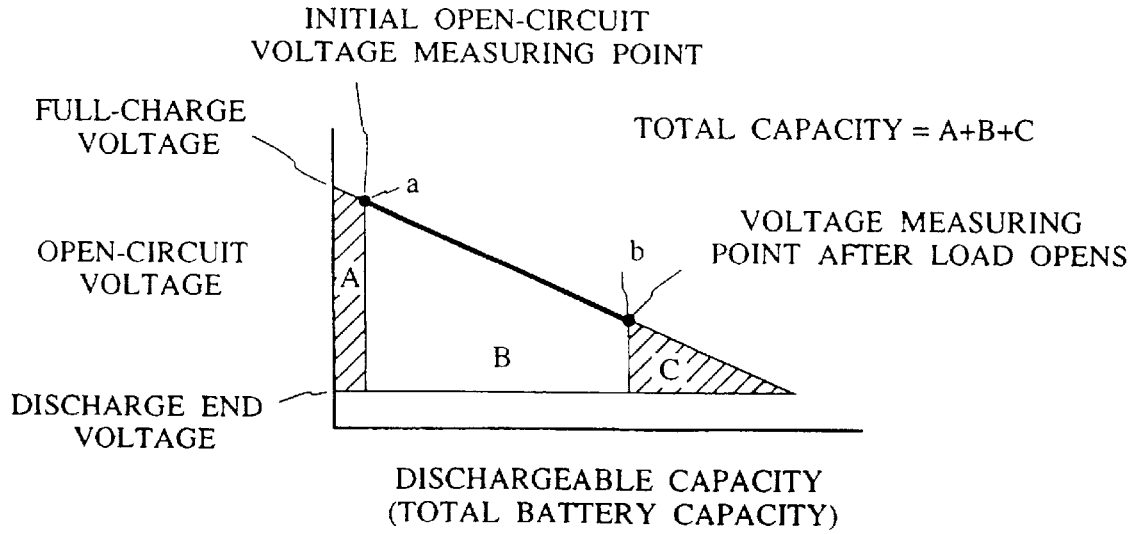

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–6 is confirmed.

* * * * *